US007773815B2

(12) United States Patent
Shen et al.

(10) Patent No.: US 7,773,815 B2
(45) Date of Patent: Aug. 10, 2010

(54) SYSTEM AND METHOD FOR COMPRESSING COMPRESSED DATA

(75) Inventors: Bo Shen, Fremont, CA (US); Zhichen Xu, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1791 days.

(21) Appl. No.: 10/891,590

(22) Filed: Jul. 14, 2004

(65) Prior Publication Data

US 2006/0015517 A1    Jan. 19, 2006

(51) Int. Cl.
    *G06K 9/36* (2006.01)
(52) U.S. Cl. .................................... 382/232; 382/235
(58) Field of Classification Search ......... 382/232–236, 382/239; 375/240.11, 240.12; 707/101; 718/100; 725/16
    See application file for complete search history.

(56) References Cited

U.S. PATENT DOCUMENTS

| 5,708,732 A * | 1/1998 | Merhav et al. ............... 382/232 |
| 6,246,438 B1 * | 6/2001 | Nishikawa et al. ..... 375/240.01 |
| 2003/0169814 A1 * | 9/2003 | Fu et al. ................ 375/240.12 |

OTHER PUBLICATIONS

Youn et al. ("Motion Estimation for High Performance Transcoding", IEEE, Published on 1998, pp. 649-658).*

* cited by examiner

*Primary Examiner*—Duy M Dang

(57) ABSTRACT

A method for compressing compressed data. Compressed files are accessed. At least a portion of the compressed files are partially decompressed into partially decompressed files in an intermediate representation. The partially decompressed files are compared. The partially decompressed files are compressed.

7 Claims, 6 Drawing Sheets

SYSTEM AND METHOD FOR COMPRESSING COMPRESSED DATA

TECHNICAL FIELD

Embodiments of the present invention relate to the field of data compression. Specifically, embodiments of the present invention relate to a method and system for compressing compressed data.

BACKGROUND ART

Multimedia files are typically stored in compressed formats, such as the Joint Photographic Experts Group (JPEG) format for images or the Moving Pictures Experts Group (MPEG) format for videos. Despite the use of compression, multimedia files often occupy a large amount of digital storage space. In order to improve compression, inter-file compression may be used. In general, inter-file compression is used for managing large amounts of text-based data files.

Currently, there are two methods for implementing inter-file compression of data. The first method, chunking, divides a group of files into segments. Identical segments are stored only once, thereby reducing the space required to store redundant portions of the group of files. The second method, delta compression, is based on the resemblance and delta among files. While both chunking and delta compression are useful for text-based data, these methods are not advantageous for compressing multimedia files. In particular, neither method provides any further compression for multimedia files.

DISCLOSURE OF THE INVENTION

Various embodiments of the present invention, a method for compressing compressed data, are described. Compressed files are accessed. At least a portion of the compressed files are partially decompressed into partially decompressed files in an intermediate representation. The partially decompressed files are compared. The partially decompressed files are compressed.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following description of the present invention, numerous specific details are set forth in order to provide a thorough understanding of the present invention. In other instances, well-known methods, procedures, components, and circuits have not been described in detail as not to unnecessarily obscure aspects of the present invention.

Aspects of the present invention may be implemented in a computer system that includes, in general, a processor for processing information and instructions, random access (volatile) memory (RAM) for storing information and instructions, read-only (non-volatile) memory (ROM) for storing static information and instructions, a data storage device such as a magnetic or optical disk and disk drive for storing information and instructions, an optional user output device such as a display device (e.g., a monitor) for displaying information to the computer user, an optional user input device including alphanumeric and function keys (e.g., a keyboard) for communicating information and command selections to the processor, and an optional user input device such as a cursor control device (e.g., a mouse) for communicating user input information and command selections to the processor.

Figure 1:
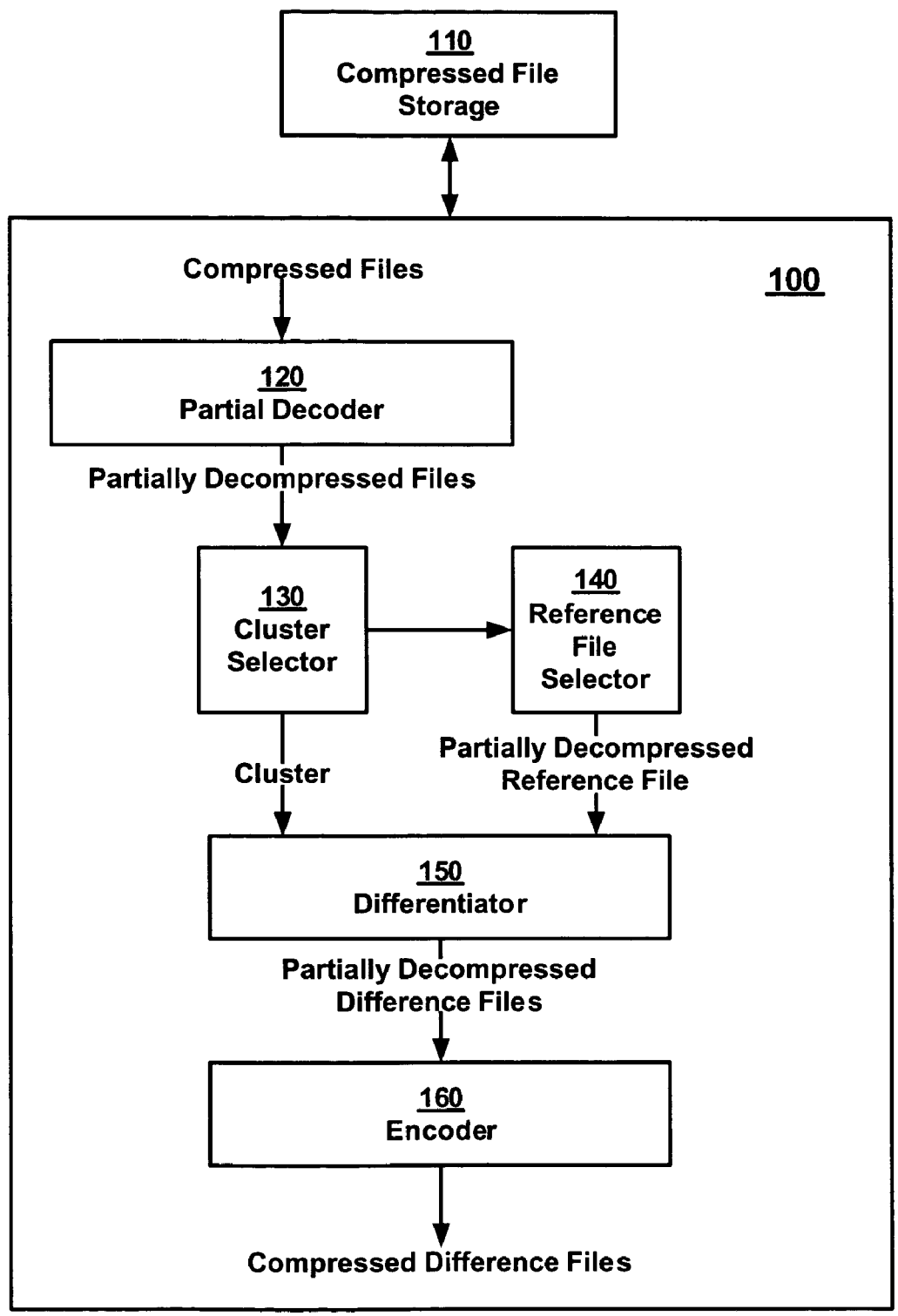
FIG. 1 illustrates a block diagram of retro-compression system for compressing compressed data, in accordance with an embodiment of the present invention.

FIG. 1 illustrates a block diagram of retro-compression system 100 for compressing compressed data, in accordance with an embodiment of the present invention. Retro-compression system 100 utilizes partial decompression to decompress compressed files and explore inter-file correlation on the compressed files at a content level. Retro-compression system 100 is communicatively coupled to compressed file storage 110 and includes partial decoder 120, reference file selector 140, differentiator 150, and encoder 160. In one embodiment, retro-compression system 100 also includes cluster selector 130. It should be appreciated that retro-compression system 100 may be implemented within a computer system or within computer systems of a distributed computer network.

Retro-compression system 100 accesses compressed files from compressed file storage 110. In one embodiment, compressed file storage 110 is a computer memory for storing data. For example, compressed file storage 110 may be a computer database for storing compressed files. In another embodiment, compressed file storage 110 may be a memory portion of a data management system for storing compressed files. It should be appreciated that compressed file storage 110 may be any memory portion of a computer system or distributed computer network operable to store information files, such as random access (volatile) memory (RAM) for storing information and instructions, read-only (non-volatile) memory (ROM) for storing static information and instructions, or a data storage device such as a magnetic or optical disk and disk drive for storing information and instructions.

In one embodiment, the compressed files are multimedia files. In one embodiment, the compressed files are image files compressed using the Joint Photographic Experts Group (JPEG) format. In another embodiment, the compressed files are video files compressed using the Moving Pictures Experts Group (MPEG) format. While the described embodiments of the present invention provide for JPEG or MPEG compressed files, it should be appreciated that any form of compressed files, such as Tagged Image File Format (TIFF), Graphics Interchange Format (GIF), a bitmap, and other form may be used.

Partial decoder 120 of retro-compression system 100 receives the compressed files. In order to facilitate a content level comparison of the compressed files, partial decoder 120 decodes the compressed files into partially decoded files in an intermediate representation. An intermediate representation is a file that is partially decoded to a level that provides content level information, but is short of complete decompression. In one embodiment, the intermediate representation is a partially decompressed file that is decompressed to the minimum level necessary to provide content level information. In one embodiment, where the compressed files are JPEG files or MPEG files, partial decoder 120 partially decodes the compressed files to an intermediate representation in the discrete cosine transform (DCT) domain. Partially compressed files in the DCT domain include content level information sufficient to provide for comparison and further compression between multiple files.

In one embodiment, the partially decompressed files are transmitted to cluster selector 130. Due to the number of compressed files and their relative similarity, it may be desirable to group similar files into clusters for facilitating improved compression and performance. Cluster selector 130 is operable to group the partially decompressed files into clusters of similar partially decompressed files. In one embodiment, cluster selector 130 generates signatures for the partially decompressed files. Generating signatures is well known in the art, and it should be appreciated that any process for generating signatures may be used. The partially decompressed files are then grouped into clusters based on the signatures. It should be appreciated that cluster selector 130 is optional.

In another embodiment (not shown) a cluster selector is operable to group the compressed files into clusters before the compressed files are received at partial decoder 120. The signatures are generated from the compressed files, and the compressed files are grouped into clusters based on the signatures. It should be appreciated that the cluster selector of the present embodiment is optional.

Reference file selector 140 is operable to select a reference file for use in comparison from the partially decompressed files. In one embodiment, where the partially decompressed files are grouped into clusters of partially decompressed files at cluster selector 130, a reference file is selected from the partially decompressed files of a cluster. In another embodiment, a reference file is selected from the partially decompressed files. That is, one reference file is selected for comparison to the other partially decompressed files. In one embodiment, the reference file is randomly selected. In another embodiment, the reference file is selected by performing an exhaustive comparison of all partially decompressed files. It should be appreciated that the reference file can be selected using any process, taking into consideration the tradeoff between computational efficiency and improved compression. For example, randomly selecting a reference file may require minimal computational resources and provide average compression, while using exhaustive comparison to select a reference file may require substantial computational resources while providing a high level of compression.

Differentiator 150 receives partially decompressed files and a partially decompressed reference file. In one embodiment, the partially decompressed files are received directly from partial decoder 120. In another embodiment, differentiator 150 receives a cluster of partially decompressed files received from cluster selector 130. Differentiator 150 is operable to determine difference files based on differences between the reference file and the other partially decompressed files. In one embodiment, the difference files are determined by subtracting the partially decompressed files from the reference file.

Encoder 160 receives the difference files, all of which are partially decoded. Encoder 160 is operable to compress the difference files into compressed difference files. The compressed difference files are stored in compressed files storage 110, replacing the original compressed files. It should be appreciated that the compressed reference file is already stored in compressed file storage 110. By compressing the difference files, retro-compression system 100 is improves the compression of the compressed files, reducing the amount of storage space of compressed file storage 110 needed to store the files. In one embodiment, encoder 160 implements run-length encoding and Huffman encoding. In another embodiment, encoder 160 implements lossless compression such as gzip.

Figure 2:
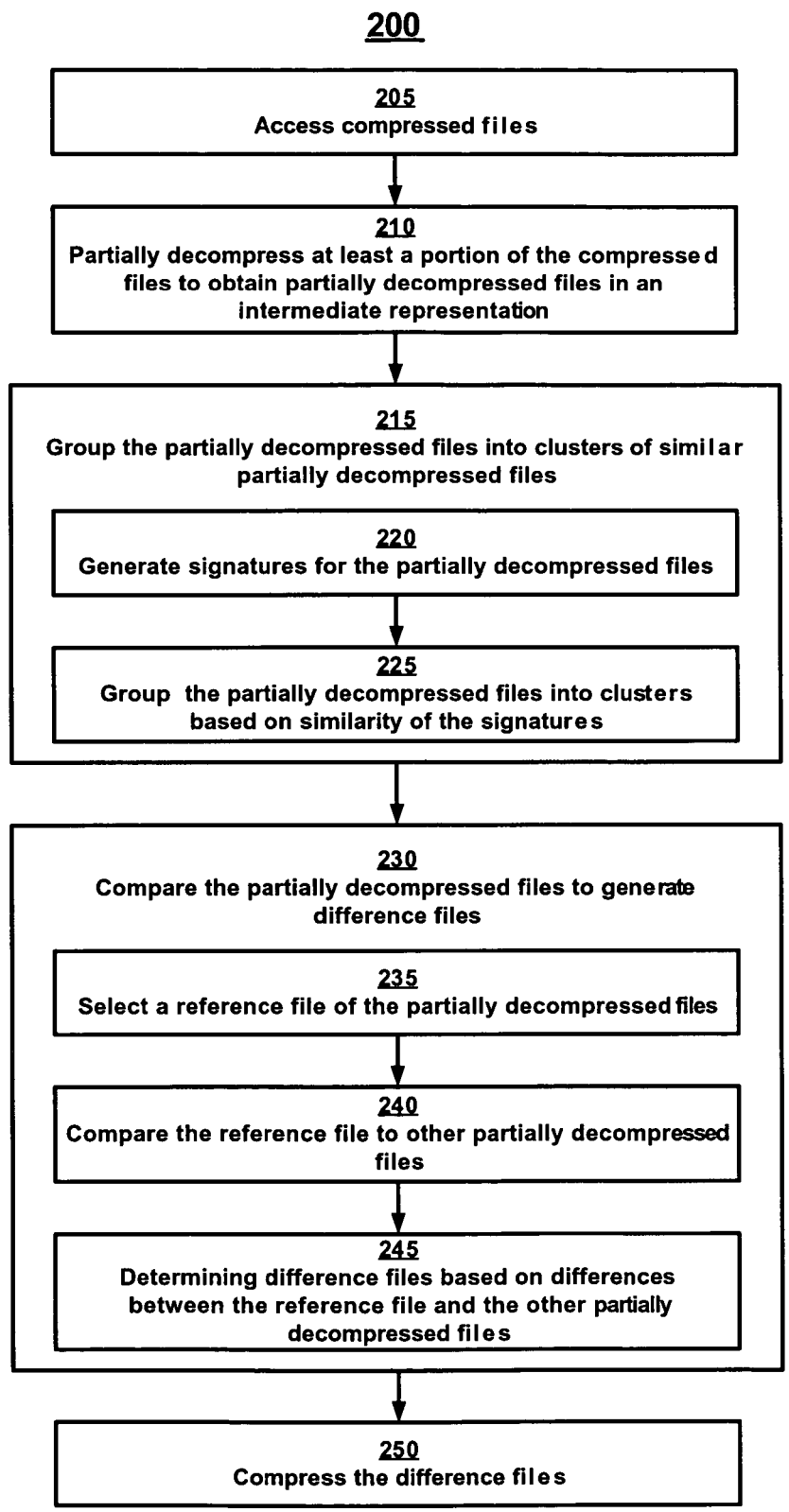
FIG. 2 illustrates flow chart of a method for compressing compressed data, in accordance with an embodiment of the present invention.

FIG. 2 illustrates flow chart of a process 200 for compressing compressed data, in accordance with an embodiment of the present invention. In one embodiment, process 200 is carried out by processors and electrical components (e.g., a computer system) under the control of computer readable and computer executable instructions. Although specific steps are disclosed in process 200, such steps are exemplary. That is, the embodiments of the present invention are well suited to performing various other steps or variations of the steps recited in FIG. 2.

At step 205, compressed files are accessed. In one embodiment, the compressed files are stored in a compressed file storage system (e.g., compressed file storage 100 of FIG. 1). In one embodiment, the compressed files are JPEG files. However, it should be appreciated that any form of compressed file may be used.

At step 210, at least a portion of the compressed files are partially decompressed to obtain partially decompressed files in an intermediate representation. In one embodiment, the compressed files are partially decompressed at a partial decoder (e.g., partial decoder 120 of FIG. 1). The intermediate representation is a file that is partially decoded to provide content level information, but is short of complete decompression. In one embodiment, the intermediate representation is a partially decompressed file that is decompressed to the minimum level necessary to provide the content level information. In one embodiment, the intermediate representation is a DCT representation.

In one embodiment, as shown at step 215, the partially decompressed files are grouped into clusters of similar partially decompressed files. In one embodiment, the partially decompressed files are grouped into clusters at a cluster selector (e.g., cluster selector 130 of FIG. 1). In one embodiment, the decompressed files are grouped into clusters according to steps 220 and 225. At step 220, signatures for the partially decompressed files are generated. In one embodiment, signatures are generated based on the digest (for example, MD5) of the partially decompressed files. It should be appreciated that any process for generating signatures may be used. At step 225, the partially decompressed files are grouped into clusters based on the similarity of the signatures. It should be appreciated that steps 215, 220 and 225 are optional.

At step 230, the partially decompressed files are compared to generate difference files. In one embodiment, the partially decompressed files are compared according to steps 235, 240 and 245. At step 235, a reference file is selected from the partially decompressed files. In one embodiment, the reference file is selected at a reference file selector (e.g., reference file selector 140 of FIG. 1). In one embodiment, the reference file is selected from a cluster of partially decompressed files. At step 240, the reference file is compared to the other partially decompressed files. At step 245, difference files are determined based on differences between the reference file and the other partially decompressed files. In one embodiment, the difference files are determined by subtracting the partially decompressed files from the reference file. In one embodiment, the difference files are generated at a differentiator (e.g., differentiator 150 of FIG. 1). It should be appreciated that many different methods may be used to generate the difference files, and that steps 235, 240 and 245 are exemplary.

At step 250, the difference files are compressed. In one embodiment, the difference files are compressed into compressed difference files and the reference file is compressed into a compressed reference file. In one embodiment, the difference files and the reference file are compressed at an encoder (e.g., encoder 160 of FIG. 1). In one embodiment, the compressed difference files and compressed reference file are then stored in a compressed file storage system, replacing the original compressed files.

Figure 3:
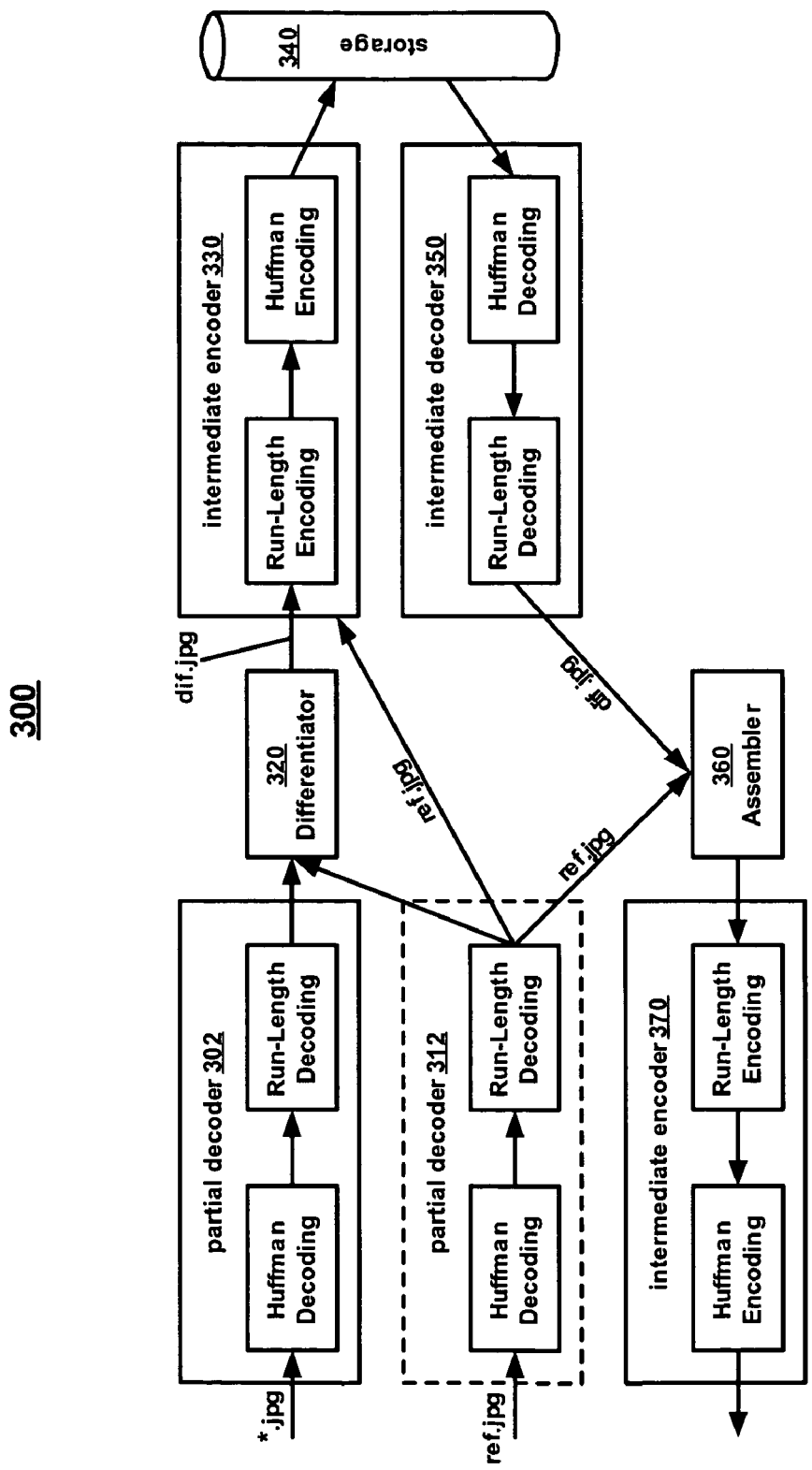
FIG. 3 illustrates a block diagram of system for compressing an restoring compressed data, in accordance with an embodiment of the present invention.

FIG. 3 illustrates a block diagram of retro-compression system 300 for compressing and restoring compressed data, in accordance with an embodiment of the present invention. Retro-compression system 300 utilizes partial decompression to decompress compressed files and determine difference files at a content level of the partially decompressed files. Retro-compression system includes partial decoder 302, partial decoder 312, differentiator 320, intermediate encoder 330, storage 340, intermediate decoder 350, assembler 360, and intermediate encoder 370. It should be appreciated that retro-compression system 300 may be implemented within a computer system or within computer systems of a distributed computer network.

Retro-compression system 300 receives a plurality of compressed files. In one embodiment, the compressed files are multimedia files. As shown, retro-compression system 300 receives JPEG files. However, as described above, it should be appreciated that any form of compressed files may be used. A reference file is selected from the plurality of compressed files. It should be appreciated that the reference file can be selected either before or after the compressed files are partially decompressed. For purposes of clarity, the reference file is labeled ref.jpg and the other compressed file is labeled *.jpg. It should also be appreciated that there may be any number of *.jpg files.

The compressed files (*.jpg and ref.jpg) are partially decompressed at partial decoders 302 and 312. It should be appreciated that retro-compression system may include any number of partial decoders. That is, *.jpg and ref.jpg may be partially decompressed at the same partial decoder or different partial decoders, as shown. For simplicity, the present embodiment is shown as including partial decoders 302 and 312. Partial decoder 302 and 312 decode *.jpg and ref.jpg into partially decoded files in an intermediate representation. In one embodiment, the intermediate representation is in the DCT domain. Partially compressed files in the DCT domain include content level information sufficient to provide for comparison and further compression between multiple files. In one embodiment, the partial encoders implement Huffman decoding and run-length decoding to partially decompress the compressed files. Huffman decoding and run-length decoding may be used in to obtain transform domain information from the compressed files, and are well known techniques.

Differentiator 320 receives the partially decompressed *.jpg and ref.jpg files. Differentiator 320 is operable to determine difference files based on differences between the ref.jpg and the other *.jpg files. In one embodiment, the difference files are determined by subtracting the partially decompressed files from the reference file. The difference between two inputs of differentiator 320 can be produced either at the frame level or the block level. At the frame level, the coefficients in the two images from the two inputs are mapped one by one, location by location, and a difference is obtained by subtraction, requiring the least computational overhead. At the block level, the whole picture is divided into non-overlapping blocks. There is one-to-one mapping within blocks from two outputs. However, one block from the first input is not necessarily mapped with the collocated block in the second input. Rather, it may be mapped to the most similar block in the second input so that the difference is minimal. Existing template/block matching techniques can be used for this mapping.

Intermediate encoder 330 receives the difference files (dif.jpg) which are partially decoded. Intermediate encoder 330 is operable to compress the difference files into compressed difference files and a compressed reference file. In one embodiment, intermediate encoder 330 implements Huffman encoding and run-length encoding to compress the files. Huffman encoding and run-length encoding may be used in compressing transform domain (e.g., DCT) information, and are well known techniques. In one embodiment, intermediate encoder 330 implements lossless compression such as gzip.

The compressed difference files are stored in storage 340, replacing the original compressed files. By compressing the difference files, retro-compression system 300 is improves the compression of the compressed files, reducing the amount of storage space of storage 340 needed to store the files. It should be appreciated that storage 340 is similar to compressed file storage 110 of FIG. 1, and may be any memory portion of a computer system or distributed computer network operable to store information files. In one embodiment, intermediate encoder 330 also receives the reference file (ref.jpg) which is partially decoded. The reference file is compressed into a compressed reference file and storage in storage 340. It should be appreciated that the compressed reference file will be no more compressed than its original corresponding compressed file.

Figure 4:
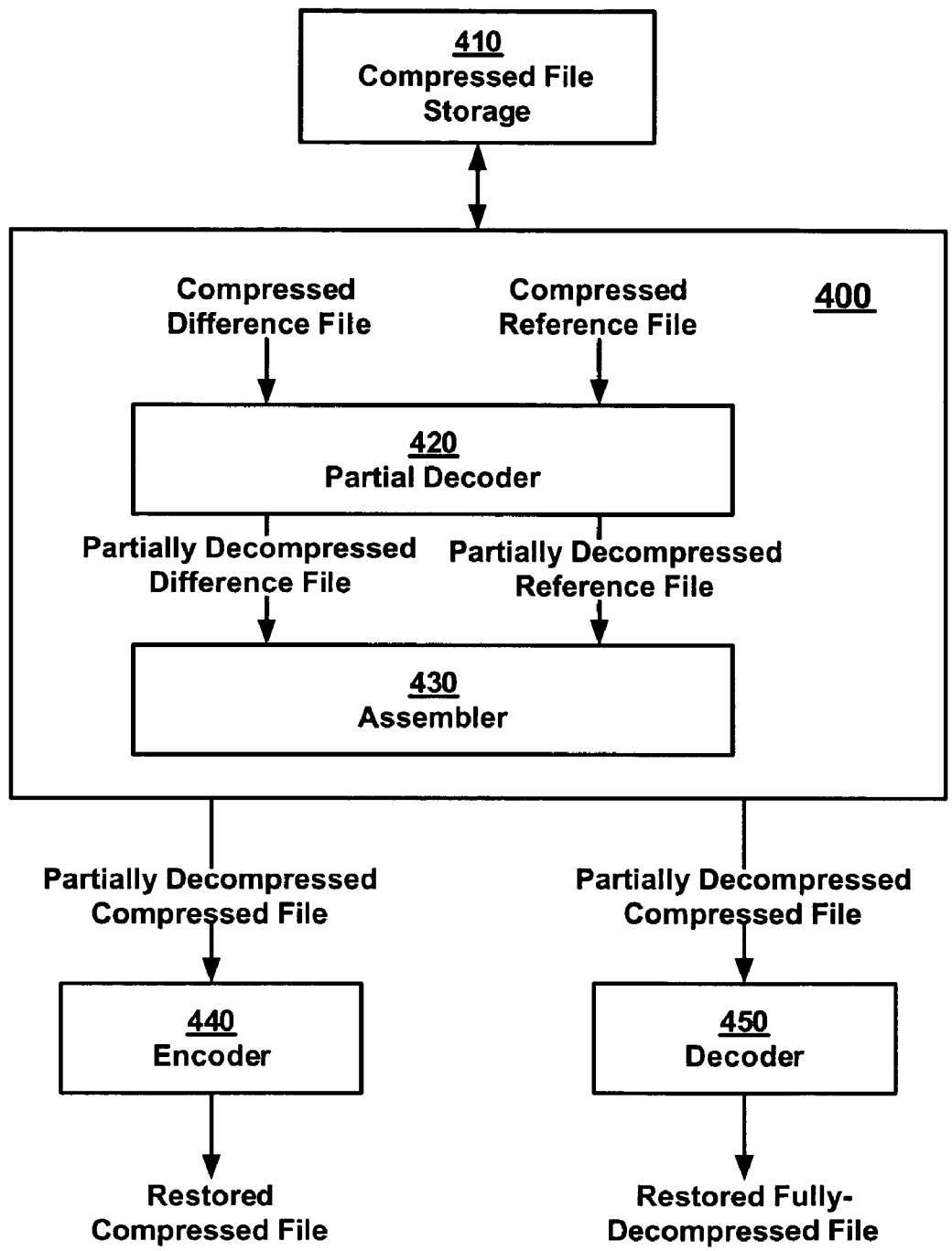
FIG. 4 illustrates a block diagram of system for restoration of compressed data, in accordance with an embodiment of the present invention.

FIG. 4 illustrates a block diagram of retro-compression system 400 for restoration of compressed data, in accordance with an embodiment of the present invention. Retro-compression system 400 utilizes partial decompression to partially decompress compressed difference and reference files generated according to process 100, in order to fully restore a file. Retro-compression system 300 is communicatively coupled to compressed file storage 410 and decoder 440, and includes partial decoder 420 and assembler 430. It should be appreciated that retro-compression system 400 may be implemented within a computer system or within computer systems of a distributed computer network.

Retro-compression system 400 accesses a compressed difference file and a compressed reference file from compressed file storage 410. In one embodiment, the files are accessed in response to a request for a fully restored file. For example, where the compressed difference file and compressed reference file are image files, a request to render the image for viewing may be received. In one embodiment, compressed file storage 410 is a computer memory for storing data. It should be appreciated that compressed file storage 410 is similar to compressed file storage 110 of FIG. 1, and may be any memory portion of a computer system or distributed computer network operable to store information files. In one embodiment, compressed file storage 410 is compressed file storage 110. As described above, in one embodiment, the compressed files are multimedia files. In one embodiment, the compressed files are JPEG files. However, it should be appreciated that any form of compressed files, such as MPEG, TIFF, GIF, bitmaps, or other form may be used.

Partial decoder 420 of retro-compression system 400 receives the compressed difference file and the compressed reference file. In order to facilitate combining the compressed files, partial decoder 420 decodes the compressed difference file and the compressed reference file into a partially decompressed difference file and a partially compressed reference file, respectively, into an intermediate representation. In one embodiment, the intermediate representation is a partially decompressed file that is decompressed to the minimum level necessary to provide content level information. In one embodiment, partial decoder 420 partially decodes the compressed files to an intermediate representation in the DCT domain.

Assembler 430 receives the partially decompressed difference file and the partially decompressed reference file. Assembler 430 is operable to combine the partially decompressed difference file and the partially decompressed reference file into a partially decompressed compressed file in the intermediate representation. In one embodiment, the partially decompressed compressed file is generated by adding the partially decompressed difference file to the partially decompressed reference file. It should be appreciated that assembler 430 is symmetric to the differentiator that generated the partially decompressed difference files (e.g., differentiator 150 of FIG. 1). In other words, both assembler 430 and the originating differentiator use the same technique, but in reverse order.

Decoder 440 receives the partially decompressed compressed file. In one embodiment, decoder 440 is an external encoder for reconstructing compressed files. In one embodiment, decoder 440 is operable to perform run-length encoding and Huffman encoding operations on partially decompressed files in the DCT domain. Decoder 440 reconstructs the partially decompressed compressed file into a restored fully-decompressed file.

Figure 5:
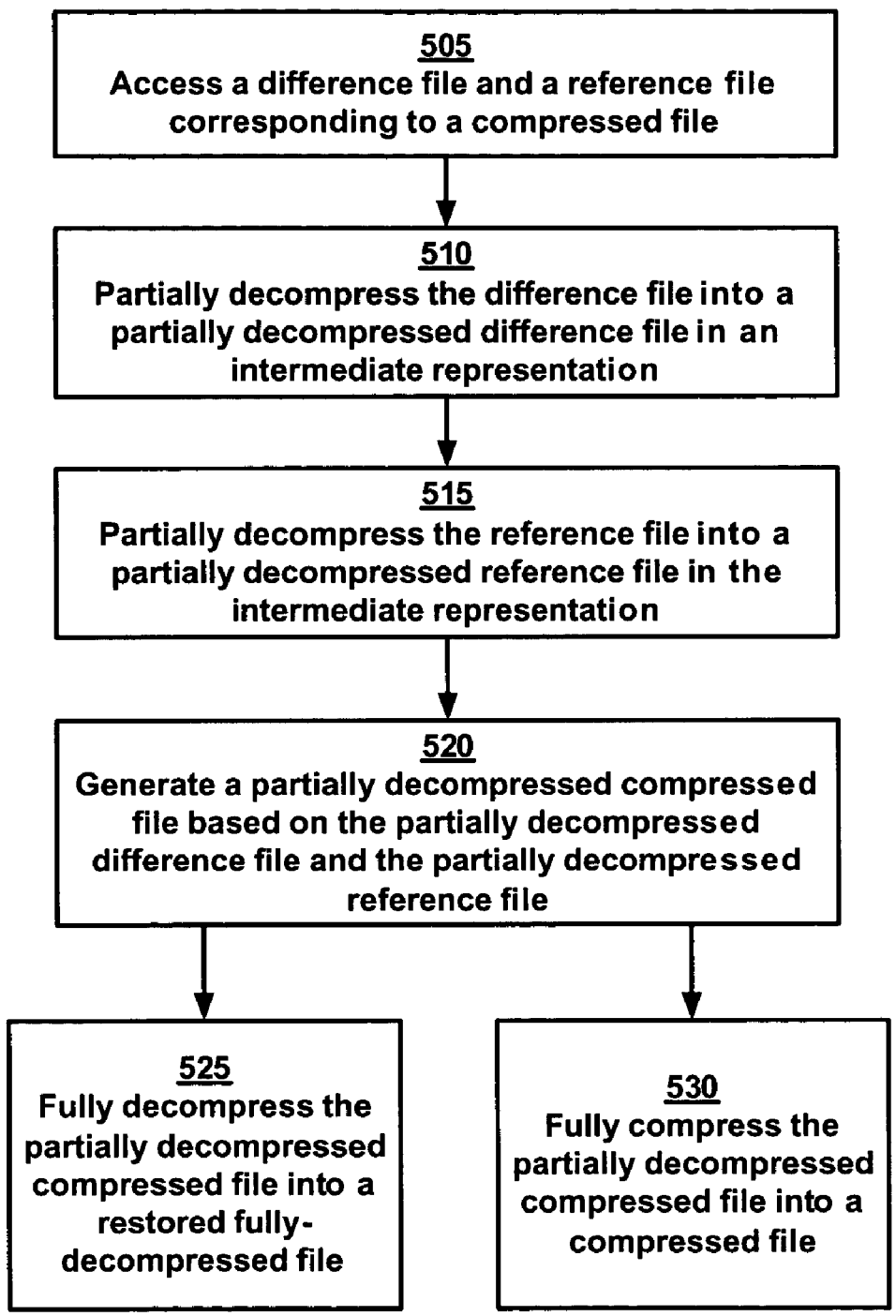
FIG. 5 illustrates a flow chart of a method for restoring compressed data, in accordance with an embodiment of the present invention.

FIG. 5 illustrates a flow chart of a process 500 for restoring compressed data, in accordance with an embodiment of the present invention. In one embodiment, process 500 is carried out by processors and electrical components (e.g., a computer system) under the control of computer readable and computer executable instructions. Although specific steps are disclosed in process 500, such steps are exemplary. That is, the embodiments of the present invention are well suited to performing various other steps or variations of the steps recited in FIG. 5.

At step 505, a compressed difference file and a compressed reference file corresponding to a compressed file are accessed. In one embodiment, the compressed difference file and a compressed reference file are stored in a compressed file storage system (e.g., compressed file storage 400 of FIG. 4). In one embodiment, the compressed files are JPEG files. However, it should be appreciated that any form of compressed file may be used.

At step 510, the compressed difference file is partially decompressed to obtain a partially decompressed difference file in an intermediate representation. At step 515, the compressed reference file is partially decompressed to obtain a partially decompressed reference file in the intermediate representation. In one embodiment, the compressed difference file and the compressed reference file are partially decompressed at a partial decoder (e.g., partial decoder 420 of FIG. 4). The intermediate representation is a file that is partially decoded to provide content level information, but is short of complete decompression. In one embodiment, the intermediate representation is a partially decompressed file that is decompressed to the minimum level necessary to provide the content level information. In one embodiment, the intermediate representation is a DCT representation.

At step 520, a partially decompressed compressed file in the intermediate representation is generated based on the partially decompressed difference file and the partially decompressed reference file. In one embodiment, the partially decompressed compressed file is generated at an assembler (e.g., assembler 430 of FIG. 4). In one embodiment, the partially decompressed compressed file is generated by adding the partially decompressed difference file to the partially decompressed reference file.

At step 525, the partially decompressed compressed file is fully decompressed into a restored file. In one embodiment, the partially decompressed compressed file is fully decompressed at a decoder (e.g., decoder 440 of FIG. 4). In one embodiment, where the intermediate representation is in the DCT domain, the partially decompressed compressed file is fully decompressed using an inverse DCT (IDCT) operation.

With reference to FIG. 3, retro-compression system 300 for compressing and restoring compressed data is shown. Retro-compression system 300 utilizes partial decompression to decompress compressed difference and reference files for restoration of the compressed files. Retro-compression system 300 accesses a compressed difference file (dif.jpg) from storage 340 and a reference file (ref.jpg). In one embodiment, the reference file is also accessed from storage 340. In one embodiment, the files are accessed in response to a request for a fully restored file.

The compressed difference file is partially decompressed at intermediate decoder 350. In one embodiment, the compressed reference file is also decompressed at an intermediate (e.g., partial) decoder. The compressed difference file and compressed reference file are partially decoded into partially decompressed files in an intermediate representation. In one embodiment, the intermediate representation is in the DCT domain. In one embodiment, the intermediate encoder 350 implements Huffman decoding and run-length decoding to partially decompress the compressed files.

Assembler 360 receives the partially decompressed difference file (dif.jpg) and the partially decompressed reference file (ref.jpg). Assembler 360 is operable to combine the partially decompressed difference file and the partially decompressed reference file into a partially decompressed compressed file in the intermediate representation. In one embodiment, the partially decompressed compressed file is generated by adding the partially decompressed difference file to the partially decompressed reference file. It should be appreciated that the operation of assembler 360 is symmetric to differentiator 320. In other words, both assembler 360 and differentiator 320 use the same technique, but in reverse order or in reciprocal manner. For example, if the differentiator uses subtraction (or division) to obtain the difference, the assembler uses addition (or multiplication) for the reconstruction.

Intermediate encoder 370 receives the partially decompressed compressed file. In one embodiment, encoder 370 is operable to perform run-length encoding and Huffman encoding operations on partially decompressed files in the DCT domain. Encoder 370 reconstructs the partially decompressed compressed file into a restored compressed file.

Figure 6:
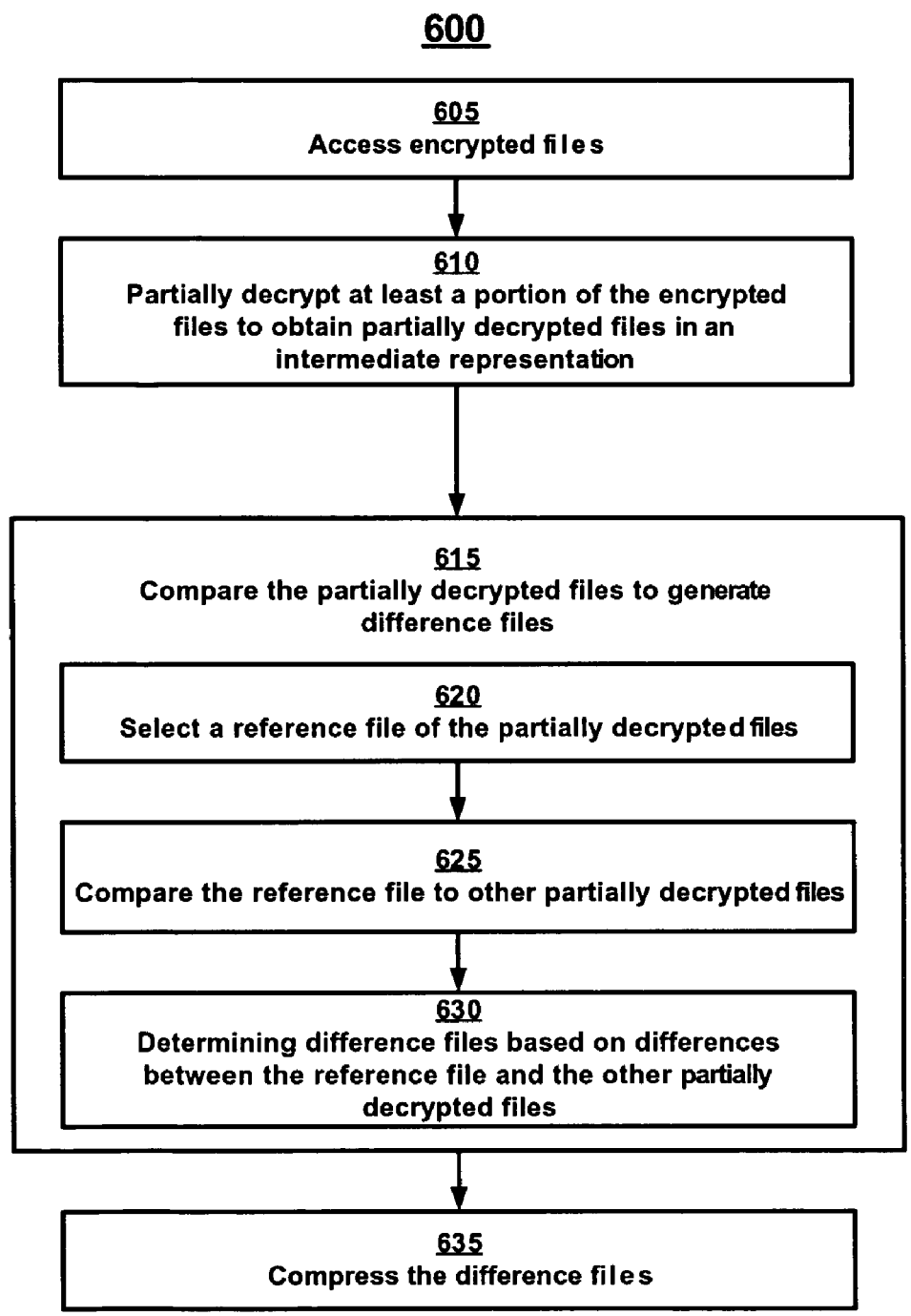
FIG. 6 illustrates a flow chart of a method for compressing encrypted data, in accordance with an embodiment of the present invention.

Encrypted data may share similar characteristics to the compressed data as described above. For example, encrypted data may be encrypted using an encryption technique having an intermediate representation. Therefore, the systems and methods described above may be applicable to the compression of encrypted data files. FIG. 6 illustrates a flow chart of a process 600 for compressing encrypted data, in accordance with an embodiment of the present invention. In one embodiment, process 600 is carried out by processors and electrical components (e.g., a computer system) under the control of computer readable and computer executable instructions. In one embodiment, process 600 is implemented by a system similar to retro-compression system 100 of FIG. 1. Although specific steps are disclosed in process 600, such steps are exemplary. That is, the embodiments of the present invention are well suited to performing various other steps or variations of the steps recited in FIG. 6.

At step 605, encrypted files are accessed. At step 610, at least a portion of the encrypted files are partially decrypted to obtain partially decrypted files in an intermediate representation. The intermediate representation is a file that is partially decrypted to provide content level information, but is short of complete decryption. In one embodiment, the intermediate representation is a partially decrypted file that is decrypted to the minimum level necessary to provide the content level information.

At step 615, the partially decrypted files are compared to generate difference files. In one embodiment, the partially decrypted files are compared according to steps 620, 625 and 630. At step 620, a reference file is selected from the partially decrypted files. In one embodiment, the reference file is selected from a cluster of partially decrypted files. At step 625, the reference file is compared to the other partially decrypted files. At step 630, difference files are determined based on differences between the reference file and the other partially decrypted files. It should be appreciated that many different methods may be used to generate the difference files, and that steps 620, 625 and 630 are exemplary.

At step 635, the difference files are compressed. In one embodiment, the difference files are compressed into compressed difference files and the reference file is compressed into a compressed reference file. In one embodiment, the compressed difference files and compressed reference file are then stored in a compressed file storage system, replacing the original encrypted files.

Various embodiments of the present invention provide systems and method for compressing and restoring compressed files. Compressed files are partially decompressed to an intermediate representation that facilitates content level correlation, avoiding the bit level inconsistency introduced by compression. Therefore, improved compression is achieved. Furthermore, partially decompressing compressed files into an intermediate representation is less computationally intensive than full file decompression. Thus, the present invention also provides improved computational efficiency. The present invention may be useful in the data management of a large number of media files, such as data stored by a media company or a digital photo editing business.

Embodiments of the present invention, a system and method for compressing compressed data, are thus described. While the present invention has been described in particular embodiments, it should be appreciated that the present invention should not be construed as limited by such embodiments, but rather construed according to the following claims.

What is claimed is:

1. A computer-implemented method for compressing compressed data, said method comprising:
   accessing compressed files at a computer system;
   partially decompressing at least a portion of said compressed files at said computer system to obtain partially decompressed files in an intermediate representation;
   comparing said partially decompressed files at said computer system to generate difference files; and
   compressing said difference files at said computer system.

2. The method as recited in claim 1 wherein said compressed files are Joint Photographic Experts Group (JPEG) files.

3. The method as recited in claim 2 wherein said intermediate representation is a discrete cosine transform (DCT) representation.

4. The method as recited in claim 1 further comprising grouping said partially decompressed files into clusters of similar partially decompressed files at said computer system.

5. The method as recited in claim 4 wherein said grouping said partially decompressed files at said computer system comprises:
   generating signatures for said partially decompressed files; and
   grouping said partially decompressed files into said clusters based on said signatures.

6. The method as recited in claim 1 wherein said comparing said partially decompressed files at said computer system comprises:
   selecting a reference file of said partially decompressed files;
   comparing said reference file to other said partially decompressed files; and
   determining said difference files based on differences between said reference file and other said partially decompressed files.

7. The method as recited in claim 6 further comprising compressing said reference file at said computer system.

* * * * *